United States Patent [19]
Mehta et al.

[11] Patent Number: 5,646,063
[45] Date of Patent: Jul. 8, 1997

[54] HYBRID OF LOCAL OXIDATION OF SILICON ISOLATION AND TRENCH ISOLATION FOR A SEMICONDUCTOR DEVICE

[75] Inventors: Sunil Mehta; Yowjuang W. Liu, both of San Jose, Calif.

[73] Assignee: Advanced Micro Devices, Inc., Sunnyvale, Calif.

[21] Appl. No.: 621,714

[22] Filed: Mar. 28, 1996

[51] Int. Cl.$^6$ .................................................. H01L 21/76
[52] U.S. Cl. ..................... 437/67; 437/69; 437/72; 148/DIG. 50
[58] Field of Search ..................... 437/67, 72, 69; 148/DIG. 50

[56] References Cited

U.S. PATENT DOCUMENTS

| | | | |
|---|---|---|---|
| 4,905,065 | 2/1990 | Selcuk et al. | |
| 5,298,450 | 3/1994 | Verret | 437/67 |
| 5,385,861 | 1/1995 | Bashir et al. | 437/67 |
| 5,445,989 | 8/1995 | Lur et al. | 437/67 |
| 5,445,990 | 8/1995 | Yook et al. | 437/69 |
| 5,457,339 | 10/1995 | Komori et al. | 257/510 |
| 5,459,096 | 10/1995 | Venkatesan et al. | 437/67 |
| 5,460,998 | 10/1995 | Liu | 437/57 |
| 5,466,623 | 11/1995 | Shimize et al. | 437/52 |
| 5,468,675 | 11/1995 | Kaigawa | 437/69 |
| 5,468,676 | 11/1995 | Madan | 437/70 |
| 5,470,783 | 11/1995 | Chiu et al. | 437/72 |
| 5,472,904 | 12/1995 | Figura et al. | 437/67 |
| 5,472,905 | 12/1995 | Paek et al. | 437/70 |
| 5,472,906 | 12/1995 | Shimize et al. | 437/72 |
| 5,473,186 | 12/1995 | Morita | 257/519 |
| 5,474,953 | 12/1995 | Shimizu et al. | 437/67 |
| 5,536,675 | 7/1996 | Bohr | 437/67 |

OTHER PUBLICATIONS

Fuse, Genshu; Fukumoto, Masanori; Shinohara, Akihira; Odanaka, Shinji; Sasago, Masaru and Ohzone, Takashi, "A New Isolation Method with Boron–Implanted Sidewalls for Controlling Narrow–Width Effect" IEEE Transactions On Electron Devices, vol. ED–34, No. 2, Feb., 1987.

Sawada, Shizuo; Higuchi, Takayoshi; Mizuno, Tomohisa; Shinozaki, Satoshi and Ozawa, Osamu "Electrical Properties for MOS LSI's Fabricated Using Stacked Oxide SWAMI Technology", IEEE Transaction on Electron Devices, vol. ED–32, No. 11, Nov. 1985.

*Primary Examiner*—Trung Dang

[57] ABSTRACT

A semiconductor structure includes isolation regions fabricated by a hybrid local oxidation of silicon (LOCOS) technique and a trench isolation technique. Wide and narrow gaps or spacings are etched in a multilayer silicon structure. The wide gaps are covered by a photoresist, and the narrow gaps are further etched to form deep trenches. The wide spacing and deep trenches are filled with an insulative material such as TEOS. The TEOS is etched and the structure is heated to cause local oxidation of silicon in the deep trench and wide spacing. The hybrid fabrication technique is particularly useful in complementary metal oxide semiconductor (CMOS) technology where wide isolation units are utilized to separate transistors sharing the same gate and trenches are utilized to isolate transistors sharing the same well.

20 Claims, 6 Drawing Sheets

HYBRID OF LOCAL OXIDATION OF SILICON ISOLATION AND TRENCH ISOLATION FOR A SEMICONDUCTOR DEVICE

FIELD OF THE INVENTION

The present invention relates to an integrated circuit or semiconductor device, and more particularly to a fabrication method for creating wide and narrow isolation regions and to a semiconductor structure having wide and narrow isolation regions.

BACKGROUND OF THE INVENTION

In general, semiconductor devices or integrated circuits (ICs) have utilized either trench isolation or selective oxidation such as local oxidation of silicon (LOCOS) to electrically insulate or isolate various portions of the semiconductor device from other portions of the device. Trench isolation typically involves etching a recess or trench in the silicon (Si) substrate, filling the trench with an insulation material such as silicon oxide by using, for example, tetra-ethylorthosilicate (TEOS), and planarizing the insulation material. LOCOS techniques typically involve growing a pad or liner oxide, depositing a nitride film, patterning and etching the nitride film and then growing or forming an oxide on a Si substrate and heating the substrate so that the exposed portions of the oxide grow to form an insulating medium in the semiconductor device.

The isolation regions for semiconductor devices vary in size depending on parameters or requirements necessary for proper electric isolation and charge carrier isolation in the device. For example, in complementary metal oxide semiconductor (CMOS) devices including integrated circuits (ICs) such as logic and memory components, both wide isolation regions and narrow isolation regions are necessary on the Si substrate to efficiently isolate certain areas of the semiconductor chip or device. Certain areas of the semiconductor chip require large isolation regions while others require small isolation regions due to different voltage requirements, dopant types, increased circuit packing density, dopant concentrations, or other criteria associated with IC design.

As various semiconductor devices or ICs have become smaller, the demands for the efficient use of space by isolation regions has increased. Heretofore, semiconductor devices have utilized either entirely trench isolation techniques, modified LOCOS techniques, or LOCOS techniques to provide isolation for the device. The use of trench isolation regions are advantageous due to their relatively small size. However, trench isolation regions are susceptible to unevenness or dishing when the trench isolation regions of different widths are planarized. Dishing is a particular problem when wide and narrow isolation regions are utilized by the semiconductor device because the insulating material (e.g., TEOS) tends to be removed from the wide isolation regions more quickly than from the narrow isolation regions. Conventional LOCOS techniques can be disadvantageous because they require relatively larger lateral spacing on the semiconductor substrate.

Thus, there is a need for wide and narrow isolation regions on a semiconductor structure which are less susceptible to dishing problems. There is also a need for a method of fabricating a semiconductor device having isolation regions formed by a space efficient process which is not susceptible to dishing problems.

SUMMARY OF THE INVENTION

The present invention relates to a method of fabricating a semiconductor structure having at least one wide spacing and at least one narrow spacing formed in a semiconductor substrate. The semiconductor substrate has a base layer, a pad oxide layer formed over the base layer, and a nitride layer formed over the pad oxide layer. The method includes steps of selectively providing an etch resist layer over the wide spacing and exclusive of the narrow spacing, etching the semiconductor structure to increase the depth of the narrow spacing to form a narrow trench, growing an oxide liner in the narrow trench and in the wide spacing, providing a trench fill oxide layer over the nitride layer and the oxide liner in the wide spacing and in the narrow trench, and field oxidizing the wide spacing and the narrow trench.

The present invention also relates to a semiconductor structure including a silicon substrate having a spacing and a trench. The trench is etched in the silicon substrate, and the spacing is selectively etched in the silicon substrate. The trench has a depth greater than the depth of the spacing, and the spacing has a width greater than the width of the trench. The spacing and the trench are filled with an insulative material. The insulative material being at least partially formed by local oxidation of silicon techniques.

The present invention further relates to a method of fabricating a semiconductor structure. The method could include steps of etching a) a first spacing and a second spacing in the semiconductor structure, b) a first spacing and selectively etching a second spacing, or c) a first spacing exclusive of a second spacing, selectively providing an etch resist layer over the second spacing and exclusive of the first spacing, etching the semiconductor structure to increase the depth of the first spacing, growing an oxide liner in the first spacing and in the second spacing, and growing the oxide liner in the first spacing and the second spacing.

The present invention even further relates to a semiconductor structure including a first well including a plurality of first type regions doped with a first type dopant, a second well including a plurality of second type regions doped with a second type dopant, and a gate provided over at least one first type region of the first type regions and at least one second type region of the second type regions. The first well is adjacent to the second well, and the first well is separated from the second well by a spacing at least partially filled by local oxidation of silicon. The first type regions are separated from each other by a deep trench at least partially filled by an oxide trench fill layer and local oxidation of silicon. The second type regions are separated from each other by the deep trench. The gate is provided over at least one first type region of the first type regions and at least one second type region of the second type regions. The gate extends over the wide spacing.

In one aspect of the present invention, a semiconductor structure has a narrow trench isolation region and a wide LOCOS isolation region. A hybrid fabrication technique efficiently places both trench isolation regions and LOCOS isolation regions on a silicon (Si) substrate. The wide isolation regions are preferably more than 6,000 Angstroms (A) wide, and the narrow isolation regions are preferably less than 6,000 A wide. The advantageous isolation technique can be utilized in CMOS device to provide transistor-to-transistor isolation in a minimal amount of space.

In another aspect of the present invention, the wide isolation region is covered with a photoresist while the narrow isolation region is dry etched by a reactive ion etch (RIE) technique. A silicon oxide such as a tetramethycyclosiloxane (TMCTS) layer or a TEOS layer is deposited in the narrow isolation regions by a low pressure chemical vapor deposition (CVD) technique. TEOS and TMCTS layers are preferred because they are conformal; however, non-conformal layers such as silane and dichlorsilane can also be used. After etching, the narrow isolation region can be doped with a dopant to provide further insulation.

The present invention advantageously eliminates or reduces dishing due to different widths of trench isolation regions. The hybrid fabrication technique utilizes the advantages of trench isolation without incurring the susceptibility to dishing problems. The hybrid technique only requires several additional steps compared to conventional trench isolation fabrication techniques.

BRIEF DESCRIPTION OF THE DRAWINGS

Preferred embodiments of the invention will hereinafter be described in conjunction with the appended drawings, wherein like numerals denote like elements, and.

DETAILED DESCRIPTION OF PREFERRED EXEMPLARY EMBODIMENTS

Figure 1:
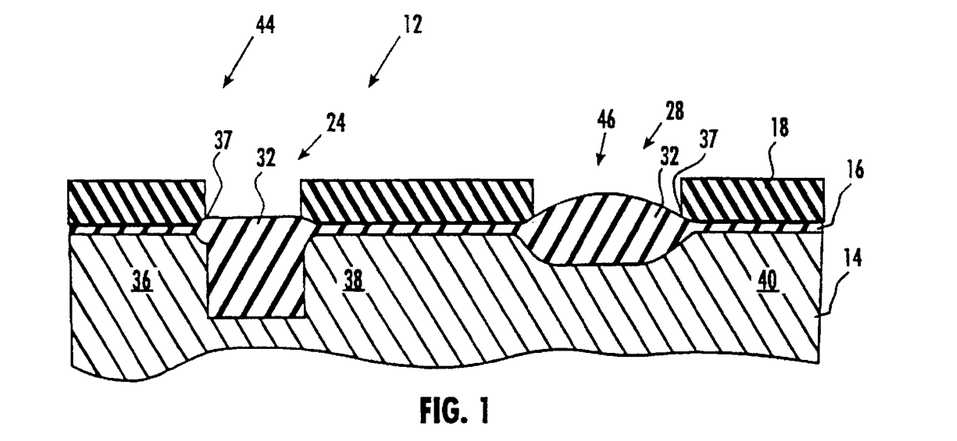
FIG. 1 is a cross-sectional view of a semiconductor device including trench isolation regions in accordance with a first exemplary embodiment of the present invention.

Referring to FIG. 1, a semiconductor device or structure 12 includes a substrate or base 14, a pad oxide layer 16, and a nitride layer 18. Structure 12 may be any type of semiconductor device or portion thereof made from any of various semiconductor processes such as CMOS process, bipolar process, or other semiconductor processes. Additionally, layers 16 and 18 may be provided by any means or fabrication techniques, and are preferably provided by thermal growth techniques and chemical vapor deposition (CVD) respectively. Semiconductor structure 12 may be part of a large integrated circuit. Additionally, base 14 of semiconductor structure 12 is preferably silicon or other semiconductor material and can be doped with P-type dopants or N-type dopants to provide various wells (not shown) for devices in structure 12.

Semiconductor structure 12 includes a trench isolation region 24 and a LOCOS isolation region 28. Trench isolation region 24 is provided in a spacing 44, and LOCOS isolation region 28 is provided in a spacing 46.

Trench isolation region 24 is between 100 to 6,000 A wide. Alternatively, trench isolation region 24 can be from 500 to 4,000 A wide and is preferably 3,000 A wide and approximately 4,000 A deep.

LOCOS isolation region 28 is preferably from 6000 to 12,000 or more Angstroms (A) wide. LOCOS isolation region 28 is preferably 8,000 A wide and from 700 to 1,500 A deep (preferably, 1,000 A deep).

Trench isolation region 24 is filled with an insulating plug or material 32. Insulating material 32 is preferably a conformal silicon oxide material typically deposited by CVD at least partially from tetraethylorthosilicate (TEOS) or tetramethycyclosiloxane (TMCTS). Alternatively, material 32 can be silicon dioxide ($SiO_2$) or other insulative substances such as polyimide saline or dichlorsilane and can be deposited by other fabrication techniques.

System parameters and design requirements may define the various dimensions for trench isolation region 24 and LOCOS isolation region 28 in base 14. For example, as the size and spacing of transistors (not shown) integrated within and above base 14 decrease, the width and depth of regions 24 and 28 can also decrease. Further, as voltage parameters change for the functional units integrated in base 14, the dimensional relationships between trench isolation region 24 and LOCOS isolation region 28 can also change. Thus, system configurations and operational parameters associated with the design of semiconductor structure 12 can serve to define the dimensions of trench isolation region 24 and LOCOS isolation region 28.

Trench isolation region 24 advantageously provides a narrow isolation region which isolates a section 36 of base 14 from a section 38 of base 14. LOCOS isolation region 28 provides a wide isolation region between section 38 of base 14 and a section 40 of base 14. LOCOS isolation region 28 and trench isolation region 24 include bird's beaks or pointed sections 37 which extend over sections 36, 38 and 40.

Figure 2:
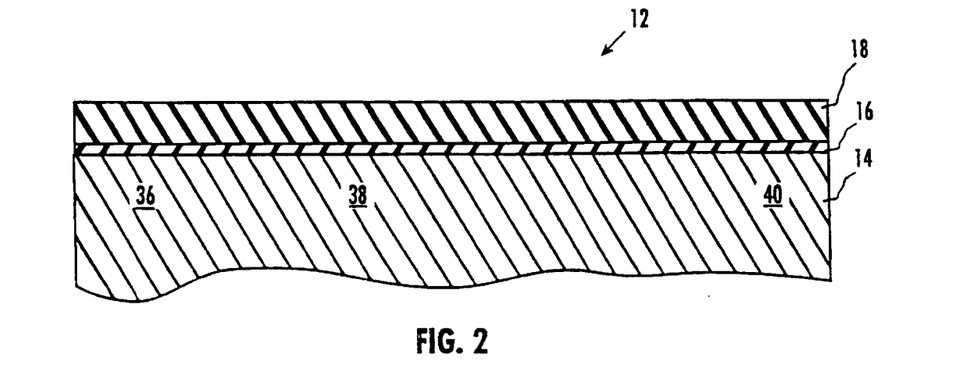
FIG. 2 is a cross-sectional view of a semiconductor structure illustrating a first step in the method utilized to manufacture the semiconductor device illustrated in FIG. 1.

The fabrication of semiconductor structure 12 is described in more detail as follows with reference to FIGS. 2–7. In FIG. 2, semiconductor structure 12 includes substrate layer or base 14, an oxidized film or pad oxide layer 16, and nitride layer 18. Base 14 is preferably silicon (Si) doped with phosphorous for N-type wells or boron for P-type wells and is significantly thicker than layers 16 and 18. Pad oxide layer 16 is grown on top of base 14 to a thickness of approximately 200 A. Pad oxide layer 16 is preferably grown by a thermal process.

Nitride layer 18 is deposited as a 1700 A thick layer by CVD on top of pad oxide layer 16. Alternatively, layers 16 and 18 may be deposited by physical vapor deposition (PVD), sputtering deposition, collimated sputtering deposition, dipping, evaporating, or other application techniques. Nitride layer 18 is comprised of silicon nitride ($Si_3N_4$) and serves as a barrier layer or etch stop for subsequent oxidation, chemical mechanical planarization and reactive ion etching. Pad oxide layer 16 provides stress relief between base 14 and layer 18 for structure 12.

Figure 3:
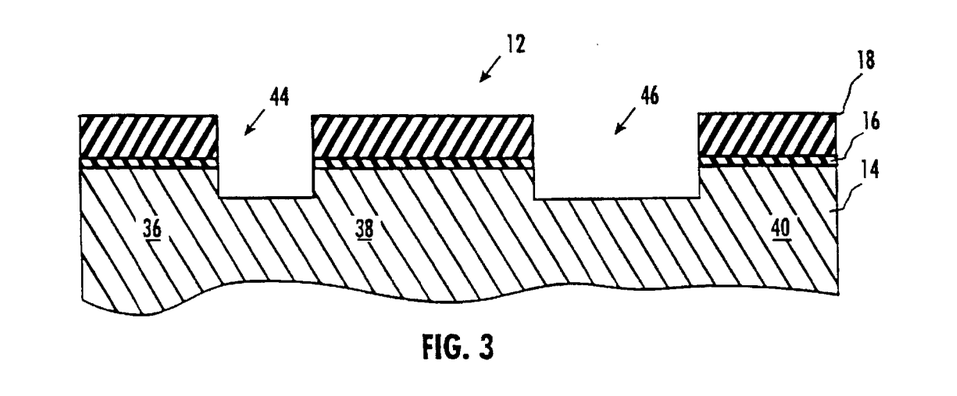
FIG. 3 is a cross-sectional view of a semiconductor structure illustrating a second step in the method utilized to manufacture the semiconductor device illustrated in FIG. 1.

With reference to FIG. 3, a narrow spacing 44 and a wide spacing 46 is etched in structure 12. Preferably, spacings 44 and 46 extend at least 100 A into base 14. Alternatively, there can be no etching of base 14 when spacings 44 and 46 are formed. Spacings 44 and 46 are dimensioned according to isolation regions 24 and 28, respectively. Preferably, spacing 44 is 4,000 A wide and 500 A deep, and spacing 46 is at least 6,000 A wide and 500 A deep.

Alternatively, spacings 44 and 46 may extend deeper into base 14 or above base 14 terminating in layer 18 or layer 16. Spacings 44 and 46 are formed by a dry etch through layers 18, 16 and part of layer 12, such as a nitride oxide etch or an RIE technique. Alternatively, spacings 44 and 46 can be cut into base 14 by wet etching or other trench forming techniques.

Figure 4:
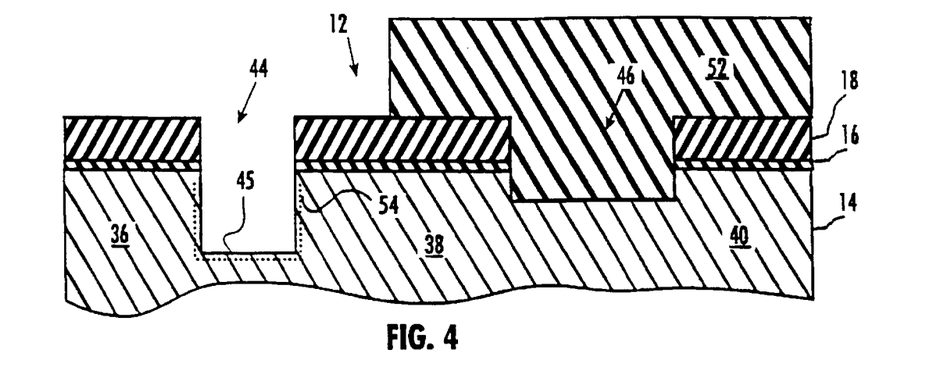
FIG. 4 is a cross-sectional view of a semiconductor structure illustrating a third step in the method utilized to manufacture the semiconductor device illustrated in FIG. 1.

In FIG. 4, a trench mask on layer 52 is provided over spacing 46 and is exclusive of spacing 44. Layer 52 is photoresist layer or etch resist. After layer 52 is placed over spacing 46, spacing 44 is etched by an RIE technique to make spacing 44 approximately 4,000 A deep, thereby forming a trench 45.

An optional trench deposit or implant 54 (shown in dotted lines) can be provided in spacing 44 to provide further isolation from devices (not shown) in regions 36 and 38 of structure 12. For example, if spacing 44 is placed in a P-well (e.g., doped with boron), boron for P-type doping can be deposited as implant 54 reaching approximately 300 A into trench 45 in base 14. Alternatively, if spacing 44 is over an N-well region, phosphorous can be implanted to provide N-type doping as implant 54.

The use of resist layer 52 over spacing 44 allows structure 12 to be advantageously manufactured so trench isolation regions are only utilized where needed, thereby providing minimum geometry and yet avoiding dishing problems. Preferably, the RIE technique which increases the depth of spacing 44 to form trench 45 is selective to Si in base 14.

Figure 5:
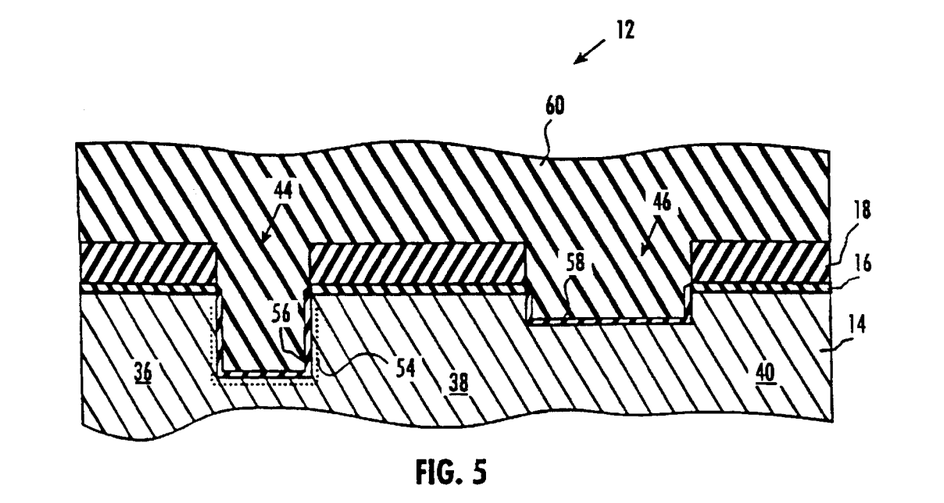
FIG. 5 is a cross-sectional view of a semiconductor structure illustrating a fourth step in the method utilized to manufacture the semiconductor device illustrated in FIG. 1.

As shown in FIG. 5, a liner oxide 56 is grown in spacing 44. A liner oxide 58 is grown in spacing 46 after resist layer 52 (FIG. 4) is removed from spacing 46. Liner oxides 56 and 58 are preferably thermally grown and have a depth of approximately 500 A on all sides in base 14. After liner oxides 56 and 58 are grown, a 4,000 to 10,000 A thick layer of tetraethyl orthosilicate (TEOS) oxide is deposited over layer 18 and spacings 44 and 46 by CVD techniques. Alternatively, other depositing techniques can be utilized to provide layer 60. Layer 60 is deposited conformally to fill spacings 44 and 46.

Figure 6:
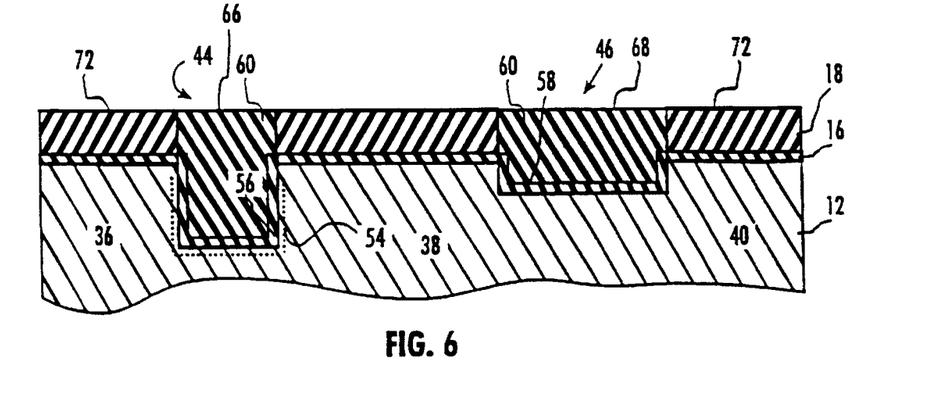
FIG. 6 is a cross-sectional view of a semiconductor structure illustrating a fifth step in the method utilized to manufacture the semiconductor device illustrated in FIG. 1.
Figure 7:
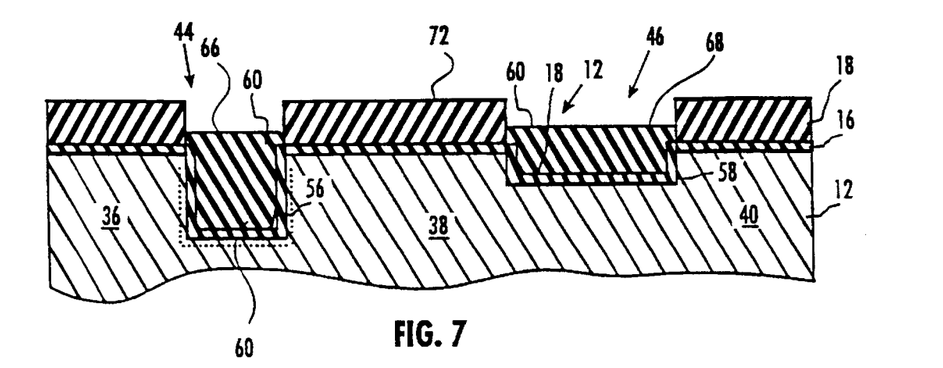
FIG. 7 is a cross-sectional view of a semiconductor structure illustrating a sixth step in the method utilized to manufacture the semiconductor device illustrated in FIG. 1.

In FIG. 6, portions of layer 60 are removed by planarization, such as a chemical mechanical planarization technique. The planarization technique removes from 0 to 300 A of nitride layer 18. During this process, layer 60 which fills spacing 46 may be subject to dishing due to the wide nature of spacing 46. After planarization of layer 60, a top surface 66 of layer 60 in spacing 44 and a top surface 68 of layer 60 in spacing 46 are etched by an oxide etch selective to nitride. Preferably, the oxide etch is an RIE technique which places top surfaces 66 and 68 of oxide layer 60 to a level 1,000 A below a top surface 72 of nitride layer 18 as shown in FIG. 7. Alternatively, the oxide etch may be a wet etch technique, RIE technique, plasma etch, or other etching process.

After layer 60 is subjected to an oxide etch, structure 12 is subjected to thermal oxidation to grow the oxide in spacings 44 and 46 by local oxidation of silicon (LOCOS) techniques (FIG. 1). The growing of layers 60 in spacings 44 and 46 provides a deeper insulative region in both regions 24 and 28 of structure 12. When subjected to thermal oxidation, the insulative material in regions 24 and 28 grows in a direction towards nitride layer 18 and base 14. Therefore, providing conventional LOCOS operation on spacings 44 and 46 creates effective isolation regions 24 and 28 for structure 12 as shown in the exemplary embodiment of FIG. 1.

Figure 8:
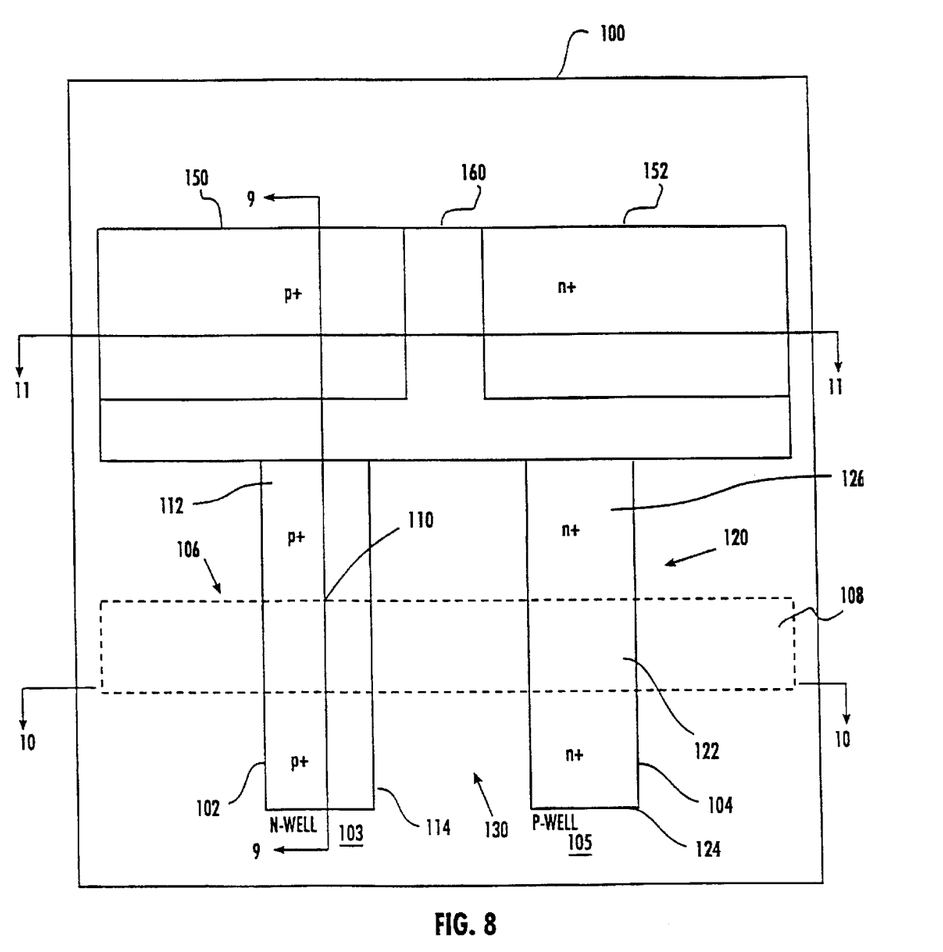
FIG. 8 is a top view of a CMOS semiconductor device including isolation regions in accordance with a second exemplary embodiment of the present invention.

With reference to FIG. 8, in accordance with an alternative embodiment of the present invention, a CMOS semiconductor structure 100 includes a P-type region 102 in an N-well 103 and an N-type region 104 in a P-well 105. Semiconductor structure 100 includes a polygate (e.g., polysilicon) conductor 108 laid on top of regions 102 and 104. A PMOS transistor 106 is formed over region 102 having a gate 110, a drain 112 and a source 114. An NMOS transistor 120 is formed over region 104 having a gate 122, a source 124 and a drain 126.

Source 114 and source 124 are separated by a wide isolation region 130. Similarly, gate 110 and gate 122 and drain 112 and drain 126, respectively, are separated by isolation region 130. Transistor 106 is separated from other transistors (not shown) associated with region 102 by a trench isolation region 134. Similarly, transistor 120 is separated from other transistors (not shown) associated with well region 104 by trench isolation region 134.

Semiconductor structure 100 also includes a P-type region 150 in well 103 and an N-type region 152 in well 105. Regions 150 and 152 are separated from transistors 106 and 120 by trench isolation region 134. Regions 105 and 152 are separated from each other by a trench isolation region 160. Trench isolation region 160 is similar to trench isolation region 134 and can be fabricated utilizing the same etch mask as used for trench isolation region 134. Alternatively, trench isolation region 160 can be a portion of trench isolation region 134 extending between regions 150 and 152 or be discrete from region 34.

As discussed in more detail below, semiconductor structure 100 can be manufactured according to the advantageous fabrication technique discussed above with reference to FIGS. 1–8. The use of such a hybrid isolation scheme for CMOS-type devices is highly advantageous because effective wide isolation regions and narrow isolation regions are created with an efficient process. Further, the use of wide isolation region 130 is necessary for CMOS devices which tend to have leakage problems related to the gate 108. When gate 108 is made of an oxide such as polysilicon on top of a thermally grown gate oxide, leakage tends to occur from the polysilicon gate to the substrate.

Figure 9:
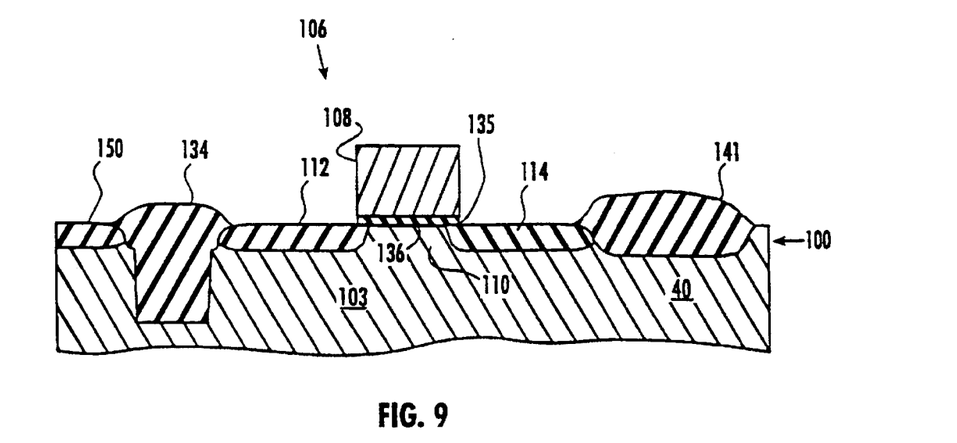
FIG. 9 is a cross-sectional view of the semiconductor device illustrated in FIG. 8 about line 9—9.
Figure 10:
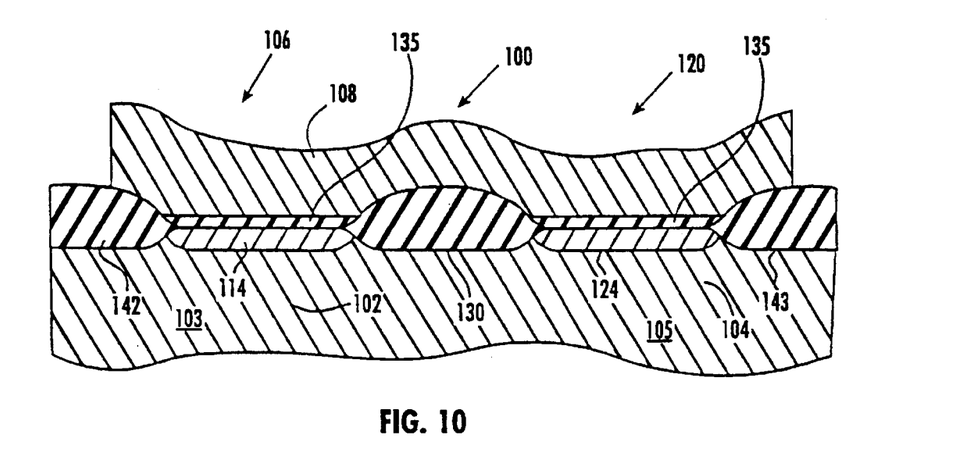
FIG. 10 is a cross-sectional view of the semiconductor device illustrated in FIG. 8 about line 10—10.

With reference to FIGS. 9 and 10, semiconductor structure 100 includes region 102 including drain 112 and source 114 highly doped with P-type dopants, gate 110, polygate conductor 108, trench isolation region 134, and a wide isolation region 141 similar to isolation region 130 (not shown in FIG. 9). Polygate conductor 108 is a polysilicon conductive element provided on an oxide layer 135 and defines channel region 136 between drain 112 and source 114. Isolation region 134 separates transistor 106 from other transistors or components (not shown) located near or within region 150 of structure 100. Trench isolation region 134 is fabricated similar to trench isolation region 24 discussed with reference to FIGS. 1–7

With reference to FIG. 10, polygate conductor 108 is provided over regions 102 and 104. Regions 102 and 104 are separated by wide isolation region 130. Wide isolation region 130 is preferably fabricated according to the advantageous fabrication technique of LOCOS isolation region 28 discussed with reference to FIGS. 1–8. Structure 100 also includes wide isolation regions 142 and 143 similar to wide isolation region 130 for isolating transistors 106 and 120 associated with well regions 102 and 104, respectively. Therefore, the hybrid isolation technique discussed above with reference to FIGS. 1–8 provides a compact isolation structure and methodology which provides superior performance in CMOS semiconductor structure 100. Wide isolation region 130 and trench isolation region 134 are advantageously utilized to provide the appropriate isolative separation between transistors 106 and 120 as well as the various devices associated with structure 100.

Figure 11:
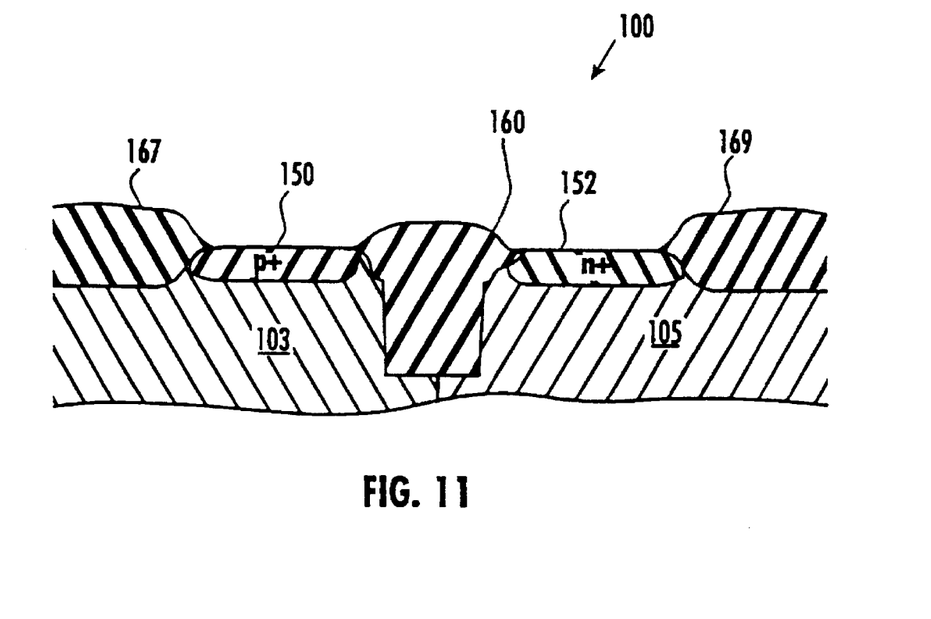
FIG. 11 is a cross-sectional view of the semiconductor device illustrated in FIG. 8 about line 11—11.

With reference to FIG. 11, trench isolation region 160 separates P-type region 150 and N-type region 152. Wide isolation regions 167 and 169 are isolate regions 150 and 152 and are similar to regions 130, 141, 142 and 143. Regions 167 and 169 can be fabricated by the advantageous technique of LOCOS isolation region 28 discussed with reference to FIGS. 1-8.

It is to be understood that, while the detailed drawings and specific examples given describe preferred exemplary embodiments of the present invention, they are for the purposes of illustration only. The present invention is not limited to the precise details, methods and conditions disclosed. For example, although dry etching is suggested, material may be removed in other processes. Further, although particular dimensions are mentioned, other dimensions associated with the isolation regions may be utilized. Further still, although TEOS is used to provide insulation, other insulative materials are interchangeable. The dimensions, sizes, thicknesses and shapes shown in the drawings are shown only in an exemplary fashion. The various layers and lines may have different thicknesses and geometries, depending on integrated circuit designs and process technologies.

What is claimed is:

1. A method of fabricating a semiconductor structure having at least one wide spacing and at least one narrow spacing formed in a semiconductor substrate, the semiconductor substrate having a pad oxide layer formed over the substrate, and a nitride layer formed over the pad oxide layer, the method comprising steps of:

selectively providing an etch resist layer over the wide spacing and exclusive of the narrow spacing;

etching the semiconductor structure to increase the depth of the narrow spacing to form a narrow trench;

growing an oxide liner in the narrow trench and in the wide spacing;

providing a trench fill oxide layer over the nitride layer and the oxide liner in the wide spacing and in the narrow trench; and field oxidizing the wide spacing and the narrow trench.

2. The method of claim 1 further comprising the steps of:

planarizing the trench fill oxide layer after the providing a trench fill oxide layer step; and oxide etching the trench selective to the nitride layer the trench fill oxide layer.

3. The method of claim 1 further comprising a step of:

filling the narrow trench with an implant after the silicon etching step.

4. The method of claim 2 further comprising a step of:

filling the narrow trench with an implant after the silicon etching step.

5. The method of claim 1 wherein the trench fill oxide layer is TEOS oxide.

6. The method of claim 2 further comprising a step of etching the trench fill oxide, the etching step being selective to nitride.

7. A method of fabricating a semiconductor structure, comprising steps of:

etching a first spacing and a second spacing in the semiconductor structure;

selectively providing an etch resist layer over the second spacing and exclusive of the first spacing;

etching the semiconductor structure to increase the depth of the first spacing;

growing an oxide liner in the first spacing and in the second spacing;

providing a trench fill oxide layer over the semiconductor substrate and in the first spacing and the second spacing; and field oxidizing the first spacing and the second spacing.

8. The method of claim 7 further comprising the steps of:

planarizing the trench fill oxide layer by chemical mechanical polishing after the providing a trench fill oxide layer step; and oxide etching the trench fill oxide layer.

9. The method of claim 8 further comprising a step of:

filling the narrow trench with an implant after the silicon etching step.

10. The method of claim 7 further comprising a step of:

providing a dopant implant to the first spacing after the etching step.

11. A method of fabricating a semiconductor structure having at least one wide spacing and at least one narrow spacing formed in a semiconductor substrate, the method comprising steps of:

selectively providing an etch resist layer over the wide spacing and exclusive of the narrow spacing;

etching the semiconductor structure to increase the depth of the narrow spacing to form a narrow trench;

providing a trench fill oxide layer in the wide spacing and in the narrow trench; and field oxidizing the wide spacing and the narrow trench.

12. The method of claim 11 further comprising the steps of:

planarizing the trench fill oxide layer after the providing a trench fill oxide layer step; and oxide etching the trench selective to the trench fill oxide layer.

13. The method of claim 11 further comprising the step of:

filling the narrow trench with an implant after the silicon etching step.

14. The method of claim 12 further comprising a step of:

filling the narrow trench with an implant after the silicon etching step.

15. The method of claim 12 further comprising a step of etching the trench fill oxide.

16. The method of claim 11 wherein the trench fill oxide layer is TEOS oxide.

17. A method of fabricating a semiconductor structure, comprising steps of:

etching a plurality of spacings;

selectively providing an etch resist layer over selected spacings and exclusive of the remaining spacings;

etching the semiconductor structure to increase the depth of the remaining spacings;

providing a trench fill insulating layer in the selected spacings and in the remaining spacings; and field oxidizing the selected spacings and the remaining spacings.

18. The method of claim 17 further comprising the steps of:

planarizing the trench fill oxide layer by chemical mechanical polishing after the providing a trench fill insulating layer step; and oxide etching the trench fill insulating layer.

19. The method of claim 18 further comprising a step of:

filling the remaining spacings with an implant after the semiconductor structure etching step.

20. The method of claim 17 further comprising a step of:

providing a dopant implant to the selected spacings after the etching step.

* * * * *